United States Patent [19]
Couet

[11] Patent Number: 5,828,266
[45] Date of Patent: Oct. 27, 1998

[54] APPARATUS AND METHODS FOR SETTING UP A TUNING FREQUENCY OF A PLL DEMODULATOR THAT COMPENSATES FOR DISPERSION AND AGING EFFECTS OF AN ASSOCIATED CERAMIC RESONATOR FREQUENCY REFERENCE

[75] Inventor: Jean-Yves Couet, Saint Martin le Vinoux, France

[73] Assignee: SGS-Thomson Microelectronics S.A., Saint Genis, France

[21] Appl. No.: 688,489

[22] Filed: Jul. 30, 1996

[30] Foreign Application Priority Data

Jul. 31, 1995 [FR] France .................................. 95 09326

[51] Int. Cl.$^6$ .............................. H03D 3/02; H03L 7/06; H03L 7/18
[52] U.S. Cl. .......................... 329/325; 375/327; 455/260; 331/11
[58] Field of Search ..................................... 329/307, 325, 329/326; 375/327; 455/260; 331/11

[56] References Cited

U.S. PATENT DOCUMENTS 5,493,713  2/1996  Horsfall et al. .......................... 329/325
5,631,601  5/1997  Horsfall et al. .......................... 329/325

FOREIGN PATENT DOCUMENTS

A-0 645 891  3/1995  European Pat. Off. .
A-2 132 042  6/1984  United Kingdom .
A-2 205 460  12/1988  United Kingdom .
WO-A-92
  04779   3/1992  WIPO .

*Primary Examiner*—Siegfried H. Grimm
*Attorney, Agent, or Firm*—Wolf, Greenfield & Sacks, P.C.; James H. Morris; Brett N. Dorny

[57] ABSTRACT

The present invention concerns apparatus and method for setting up the tuning frequency of a PLL, demodulator that includes a VCO. Frequency synthesizing circuitry controls the VCO via a first switched control path. Comparison circuitry provides a first signal that corresponds to the difference between the output frequency of the VCO and a reference frequency. Control circuitry is provided that is responsive to a plurality of signals including the first signal for operatively controlling the apparatus. The apparatus further includes: a ceramic resonator oscillator for providing the reference frequency; a non-volatile memory for storing the value of the first signal; and comparison circuitry for comparing a stored value of the first signal with a current value of the first signal so as to produce a second signal for adjusting the tuning frequency of the frequency synthesizing circuitry in response to the second signal.

26 Claims, 3 Drawing Sheets

APPARATUS AND METHODS FOR SETTING UP A TUNING FREQUENCY OF A PLL DEMODULATOR THAT COMPENSATES FOR DISPERSION AND AGING EFFECTS OF AN ASSOCIATED CERAMIC RESONATOR FREQUENCY REFERENCE

BACKGROUND OF THE INVENTION

1. Field of the Invention

The present invention relates to an apparatus and method for setting up a tuning frequency of a phase-locked loop demodulator. The present invention compensates for dispersion and aging effects of a resonating frequency of an associated ceramic resonator.

The present invention is applicable to systems that receive a plurality of carrier frequencies and is particularly applicable to sound demodulation that is associated with analog satellite receivers.

2. Discussion of the Related Art

FIG. 1 illustrates a basic block diagram of a circuit that is used to set up the tuning frequency of a phase-locked loop demodulator.

The phase-locked loop demodulator 100 includes: a voltage controlled oscillator (VCO) 110; a phase detector 120; a low pass filter 130 (LPF); and a programmable attenuator 140.

The circuit for setting up the tuning frequency of the phase-locked loop (PLL) demodulator 100 includes: first and second switches S1, S2 that are respectively controlled by anti-phase signals CS and NCS; a capacitor 145; a frequency synthesizing circuit 150; a frequency comparator 160; a reference frequency generator 170; and a control circuit 180.

The demodulation approach adopted with this circuit is direct. That is to say, the signal demodulation is performed directly at the sub-carrier frequency, i.e., there is no frequency shift. The VCO 110 of the PLL demodulator 100 is controlled by the frequency synthesizing circuit 150. The adjustable attenuator 140 provides the required control of the PLL demodulator's gain, i.e., the lock and capture ranges. Such precision is necessary so as to avoid locking onto an undesired adjacent subcarrier and to be compatible with different deviations in the subcarriers.

The British Patent Applications GB9320067.3, GB9320068.1 and GB9320069.9, which are all assigned to SGS-THOMSON Microelectronics Ltd., describe in more detail the structure and operation of the basic block diagram of FIG. 1 and are herein incorporated by reference.

FIG. 2 illustrates a basic block diagram of the frequency synthesizing circuit 150.

The frequency synthesizing circuit 150 includes: a programmable frequency divider 200, a phase comparator 210 for comparing the frequency signals fDIV and fREF that are respectively supplied by the programmable frequency divider 200 and the reference frequency generator 170; and a controlled current source/sink circuit IS1, IS2, S3, S4 for sourcing and sinking current to and from the input of the VCO via switch S2. Switches S3 and S4 are operatively controlled by outputs of the phase comparator 210. With successive charges and discharges through switch S2, the voltage across the capacitor 145 reaches the required value so as to operatively control the VCO.

The aforementioned British Patent Applications GB9320067.3 and GB9320069.9 describe in more detail the structure and operation of the basic block diagram of FIG. 2.

Commercial products that utilize the block diagrams of FIGS. 1 and 2 are available from SGS-THOMSON Microelectronics, and are denoted by the part numbers STV0020, STV0030, STV0042 and STV0056. The above-mentioned products are supported by an 'advance data' data sheet (dated May 1995) which is herein incorporated by reference.

The reference frequency generator 170 illustrated in FIGS. 1 and 2 is normally provided by an oscillator circuit that includes a piezoelectric crystal.

It is well known in the art that piezoelectric crystals, commonly referred to as quartz crystals or just simply crystals, can be manufactured such that their resonant frequencies are very accurate. Furthermore, it is possible to very accurately control the dispersion between one quartz crystal and another, or in other words, the manufacturing tolerances that can be attained for a series of quartz crystals can be extremely high.

Typically, the frequency tolerance from one crystal to another varies by approximately 0.001% and the frequency stability by approximately 0.01%, where frequency stability is defined as the frequency tolerance over an operating temperature range with respect to a frequency at a reference temperature. Also, even though the long-term stability of a crystal is affected by a number of complex factors, its variation over a ten year period for example will be typically 0.001%.

Although a piezoelectric crystal is used to provide an accurate dependable frequency reference it does however suffer from the problem of being expensive. This expense is of course relative to the components with which it is associated.

The general cost of semiconductor related systems is rapidly decreasing due to modern integration processes and methods. However, since the science and technology associated with manufacturing piezoelectric crystals is moving, relative to semiconductor devices, at a much slower place, the cost associated with the manufacturing of such accurate and dependable crystals is therefore becoming more and more significant in terms of the overall system costs.

SUMMARY OF THE INVENTION

An object of the present invention is to provide an alternative cost effective solution to that of a piezoelectric crystal.

Another object of the present invention is to provide an alternative solution to a piezoelectric crystal that provides a reasonable frequency tolerance and reasonable long-term and short-term frequency stability.

Another object of the present invention is to replace the piezoelectric crystal with a less expensive ceramic resonator.

Another object of the present invention is to compensate for any changes in the frequency tolerance and long term or short term stability of a ceramic resonator.

In order to achieve these objects, the present invention proposes an apparatus for setting up the tuning frequency of a phase-locked loop demodulator that includes a voltage controlled oscillator and a first switch. The apparatus also includes frequency synthesizing circuitry whose output is connected to a second switch. The frequency synthesizing circuitry receives an output from the voltage controlled oscillator which is proportional to the frequency of the voltage controlled oscillator and a reference frequency for operatively controlling, via said second switch, the voltage controlled oscillator. Also included in the apparatus is circuitry for providing a first signal which corresponds to the difference between the output frequency of the voltage controlled oscillator and the reference frequency and circuitry that is responsive to a plurality of signals including the first signal for operatively controlling the apparatus, including selecting the tuning frequency of the frequency synthesizing circuitry. The apparatus further includes: a ceramic resonator oscillator in the reference frequency generator for providing the reference frequency; a latch or some other suitable memory circuit for storing the value of the first signal; and comparison and calibration circuitry that is capable of comparing the stored value of the first signal with a current value of the first signal so as to produce a second signal for adjusting the tuning frequency of the frequency synthesizing circuitry in response to the second signal, i.e., for calibrating the tuning frequency of the frequency synthesizing circuitry.

According to other embodiments of the present invention, the calibration means includes a microprocessor and an associated memory, for example a non-volatile E2PROM memory, for storing the value of the first signal. The memory may be monolithically integrated along with the microprocessor. Additionally, the memory may be a non-volatile memory.

According to another embodiment of the present invention, the value of the first signal is initially stored as part of a testing procedure during the manufacturing of the apparatus.

According to other embodiments of the present invention, updated values of the first signal can be stored during the operation of the apparatus and/or the power-up or start sequence of the apparatus and/or the power-down or stop sequence of the apparatus.

The apparatus, according to other embodiments of the present invention, can be used in satellite signal receiver systems, radio signal receiver systems, television signal receiver systems and video signal receiver systems and any combination of said systems.

According to another embodiment of the present invention, a method is provided for setting up the tuning frequency of a phase-locked loop demodulator that includes a voltage controlled oscillator. The method includes the steps of: generating a reference frequency; connecting a frequency synthesizer to the voltage controlled oscillator; synthesizing a tuning frequency for the voltage controlled oscillator that substantially corresponds to a required carrier frequency; generating a first signal that corresponds to the difference between the synthesized tuning frequency and the reference frequency; disconnecting the frequency synthesizer from the voltage controlled oscillator; connecting a plurality of carrier frequencies to the phase-locked loop demodulator; and adjusting the voltage controlled oscillator such that its frequency corresponds to a desired carrier frequency. The method further includes the steps of: generating the reference frequency by means of circuitry that includes a ceramic resonator; storing the value of the first signal; comparing the stored value of the first signal with the current value of the first signal; producing a second signal in response to said comparison; applying the second signal to the frequency synthesizer; and adjusting the tuning frequency in response to the second signal.

According to another embodiment of the present invention, the step of memorizing the value of the first signal is initially carried out as part of a testing procedure during the manufacturing process.

According to other embodiments of the present invention, the method further includes the step of updating the memorized value of the first signal during normal operation and/or the power-up or start sequence and/or the power-down or stop sequence.

BRIEF DESCRIPTION OF THE DRAWINGS

These and other objects, as well as other advantages and features, of the present invention will become apparent in light of the following detailed description and accompanying drawings among which.

DETAILED DESCRIPTION OF THE INVENTION

Although this invention will be described in connection with certain embodiments, it should be understood that the present disclosure is to be considered as an exemplification of the principles of the invention and that there is no intention of limiting the invention to the disclosed embodiments. On the contrary, it is intended that all alternatives, modifications and equivalent arrangements as may be included within the spirit and scope of the appended claims be covered as part of this invention.

Figure 3:
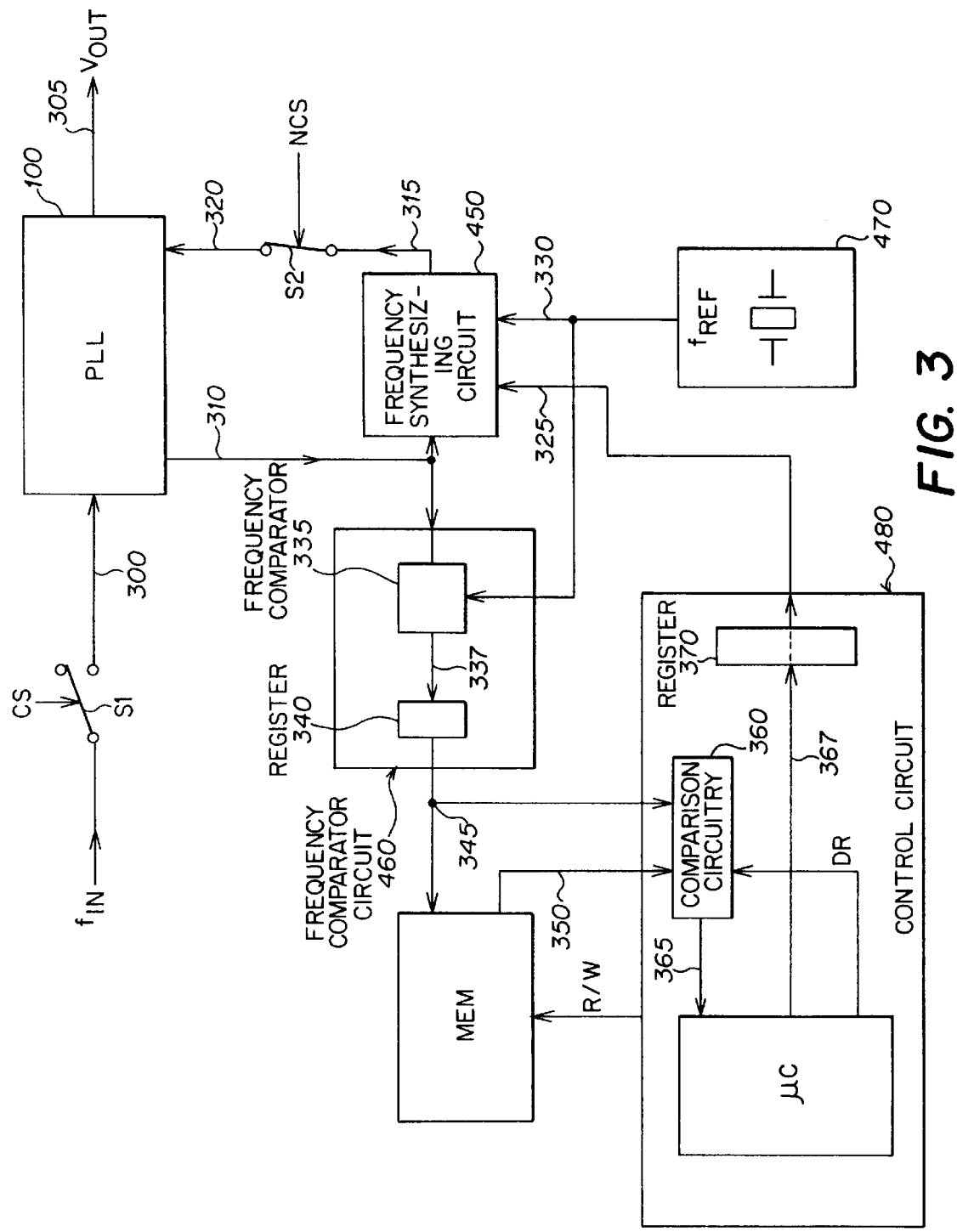
FIG. 3 illustrates a block diagram of a circuit that is used to set up the tuning frequency of a phase-locked loop demodulator according to an embodiment of the present invention.

FIG. 3 illustrates a block diagram of a circuit that is used to set up the tuning frequency of a phase-locked loop demodulator according to an embodiment of the present invention.

Figure 1:
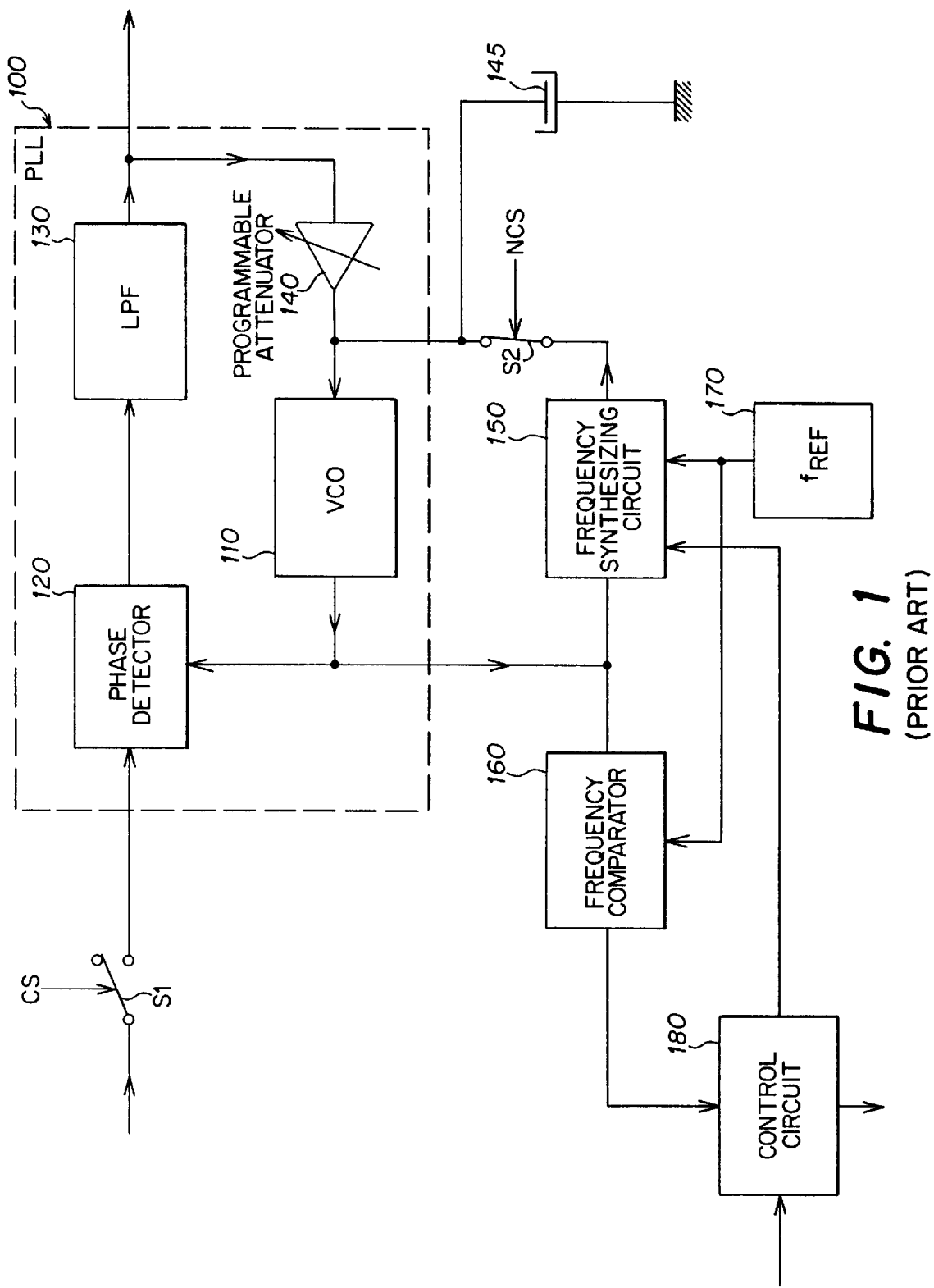
FIGS. 1 and 2 have already been depicted as exposing the state of art and the problem to overcome.

Although not illustrated, the phase-locked loop demodulator 100 includes the VCO 110, the phase detector 120, the low pass filter 130, and the programmable attenuator 140 as shown in FIG. 1. The circuit for setting up the tuning frequency of the PLL demodulator includes, the switches S1 and S2, a frequency synthesizing circuit 450, a frequency comparator 460, a reference frequency generator 470, and a control circuit 480.

Referring to FIG. 3, the input terminal 300 to the demodulator 100 receives, via switch S1, the plurality of input carrier signals fIN. The output terminal 305 of the demodulator provides the required demodulated output signal VOUT.

The output terminal 310 of the VCO is received by a frequency synthesizing circuit 450 and a frequency comparator 460. The output terminal 315 of the synthesizing circuit 450 is connected to the input terminal 320 of the VCO via switch S2.

Figure 2:
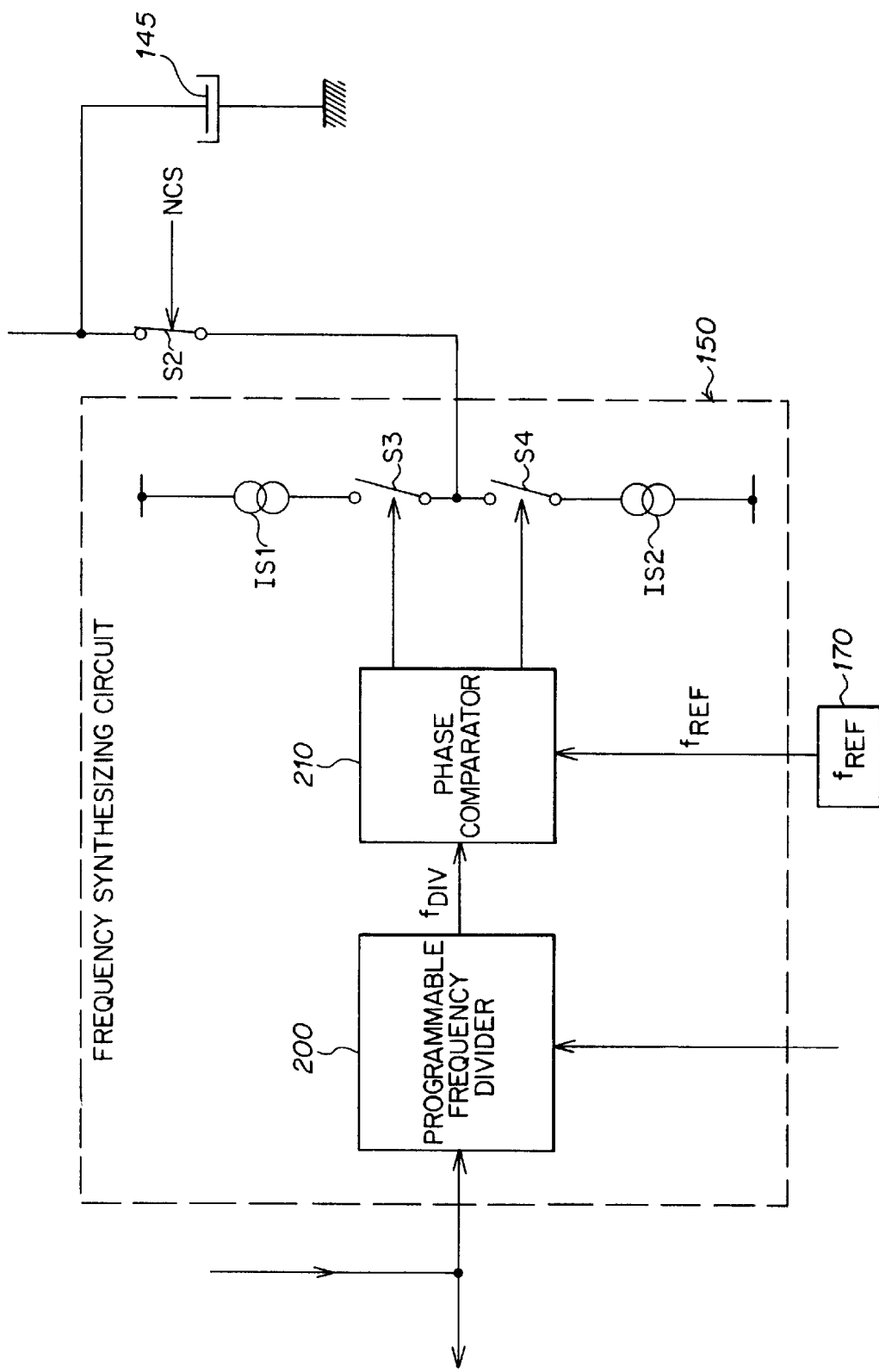

A frequency divider and phase comparator (similar to the frequency divider 200 and phase comparator 210 illustrated in FIG. 2) within the synthesizing circuit 450 receive the respective outputs 325 and 330 from a control circuit 480 and a reference frequency generator 470.

According to an embodiment of the present invention, the reference frequency generator 470 uses a ceramic resonator as the basis for generating a reference frequency. A piezoelectric crystal is substituted with a ceramic resonator such that the method and circuitry compensate for the relatively large tolerance and stability dispersions associated with a ceramic resonator.

In reality, the frequency tolerance and long-term frequency stability of a typical ceramic resonator are both in the order of approximately +/−0.5% and it is these excessive dispersions that are the root of the problem having contemplated using a ceramic resonator. This +/−0.5% frequency tolerance is at the extreme limit of acceptability, especially for industrial mass production and can thus not be relied upon. Furthermore, the +/−0.5% long-term frequency stability is, in the case of industrial mass production, totally unacceptable.

The solution according to an embodiment of the present invention is somewhat convoluted in that a straight substitution of a ceramic resonator for a crystal introduces these tolerance and stability problems. So having solved one non-technical cost related problem, another more serious technical non-cost related problem is created, or in other words, there is a nested problem to the solution of the original problem. However, as will be seen, the embodiment of the present invention overcomes both of the problems that are associated with substituting the piezoelectric crystal with a ceramic resonator.

The frequency comparator 460, which is similar to that described in the aforementioned STV0042/56 data sheet and referred to as a watchdog, includes a frequency comparator 335 that is capable of measuring and comparing the frequency at the output terminal 310 of the VCO 110 with that at the output terminal 330 of the reference frequency generator 470. The result of the comparison is received, via an output 337, by a register 340. The register 340 holds, i.e., temporarily stores, the resultant value of the comparison in a suitable format, for example a digital format, that is acceptable to the elements downstream of this register.

The output 345 of the watchdog register 340 is supplied to a memory circuit MEM. The memory circuit MEM is preferably a Read/Write non-volatile type memory, an example being a E2PROM memory, whose read and write cycles are controlled by a R/W control signal that is provided by the control circuit 480.

The respective outputs 350 and 345 from the memory MEM and the watchdog register 340 are received by comparison circuitry 360. This comparison circuitry 360 compares the data, which relates to frequency measurements, and supplies a result, via an output 365, to a microcontroller μC. The microcontroller μC requests data from the comparison circuit 360 via a control signal DR.

Based on the result supplied to the microcontroller μC by the comparison circuit 360, the microcontroller μC supplies data, via an output 367, to another register 370 that is associated with the frequency synthesizing circuit 450. Register 370 is used to hold or latch the data for programming the frequency divider of the frequency synthesizing circuit 450 (see FIG. 2) including the additional data that is required for adjusting the frequency divider should there be any dispersion of the frequency tolerance and/or stability of the ceramic resonator.

It should be understood that the microcontroller μC can also directly access the data from the watchdog register 340 and the memory MEM and that the outputs 337, 345, 350, 365 and 367 may be data bus type parallel outputs.

Having described the basic set-up of the components according to an embodiment of the present invention, there now follows a detailed description of an embodiment of one possible method of how the elements interact so as to solve the tolerance and stability problems inherently associated with a ceramic resonator.

According to an embodiment of the present invention, the proposed method can be categorized into two distinct general operations. The first operation involves the calibration of a ceramic resonator and indeed its direct and indirect associated circuitry. The second operation involves compensating for changes in the tolerance and/or stability of the ceramic resonator.

In this first operation, the accuracy of the reference frequency, derived from a ceramic resonator, is not yet known. However, the reference frequency can, in theory, be assumed to correspond to a required carrier frequency fo and to be exact. Therefore, in such a theoretical case, the output frequency of the VCO 110 will be given by:

$$fVCOTH=fo=fREFTH*NTH;$$

where FREFTH is an ideal theoretical reference frequency and NTH is a theoretical coefficient to be used in adjusting the frequency synthesizer 450.

In practice, the reference frequency FREF is not ideal and its dispersion is not negligible. Consequently, the actual output frequency (fVCOA) of the VCO will be given by:

$$fVCOA=fREFA*N;$$

where fREFA is the actual reference frequency.

Using the same, or a similar, arrangement of elements as shown in FIG. 3, it is possible to measure the actual accuracy of the reference frequency by carrying out the following steps.

Step #1 includes respectively opening and closing switches S1 and S2. Switch S1 acts to block a plurality of input carrier frequency signals fIN from passing through to the demodulator 100 and switch S2 operatively connects the frequency synthesizer 450 to the VCO 110 of the demodulator 100. It should be noted that switches S1 and S2 are controlled in anti-phase by the respective control signals CS and NCS.

Step #2 includes driving, i.e., controlling, the VCO 110 by means of the frequency synthesizer 450 so as to obtain an output signal that corresponds to a frequency value of fVCOA, where fVCOA substantially corresponds to a required carrier frequency fo. It should be understood that the VCO 110 is driven by the frequency synthesizer 450 which is in turn driven by the reference frequency generator 470 that contains the ceramic resonator. It should also be understood that in the very first instance the frequency synthesizer 450 is programmed with an arbitrary coefficient NARB for adjusting the frequency synthesizer 450. This arbitrary coefficient NARB could have either a positive, negative or zero value.

Step #3 includes, having stimulated the VCO 110 to produce an output frequency value equal to fVCOA, comparing the signal fVCOA and the actual reference frequency FREFA. The result of this comparison is held in the register 340 and stored in the non-volatile memory MEM. The frequency comparator 460 produces the resultant signal of the comparison between the signals fVCOA and FREFA, which is in the very first instance of the comparison of fVCOA and FREFA, the coefficient NTH which is to be used during the adjustment of the frequency synthesizer 450.

Step #4 includes, having completed the non-volatile storage of the coefficient NTH, respectively opening and closing switches S1 and S2. Switch S1 now acts to pass the plurality of input carrier frequency signals fIN to the demodulator 100, including the required carrier frequency fo. Switch S2 now acts to operatively disconnect the frequency synthesizer 450 from the VCO 110. Therefore, with switch S2 open, the frequency synthesizer 450 no longer plays an active role. Because of the capture range of the PLL demodulator 100 and the fact that fVCOA substantially corresponds to a required carrier frequency fo, the VCO 110 will automatically lock onto the required carrier frequency fo. Therefore, the value fVCOA changes to the value of the required carrier frequency fo, i.e., FVCOA changes to fVCOA=fo.

Step #5 includes, once the required carrier frequency fo has been captured, comparing it with the actual reference frequency fREFA. Since the running frequency of the VCO 110 has now been changed from FVCOA to fo, the frequency comparator 460 now produces another signal NM as a result of comparing fREFA and fo, i.e., fVCOA.

Step #6 includes, by recalling the stored resultant value for the theoretical coefficient NTH and comparing it with the current value NM, obtaining a precise measurement of the actual accuracy of the reference frequency, as illustrated by the following formulae:

fo=fREFTH*NTH;

fVCOA=fREFA*NTH; and fo=fREFA*NM.

Therefore fREFA=fREFTH*(NTH/NM).

The result of the calibration operation is stored in the non-volatile memory MEM. The results of this calibration operation can, for example, be stored, that is to say the values of the signals NTH and NM can be stored individually and then operatively processed so as to obtain the result C=NTH/NM. Alternatively, the results NTH and NM can be processed to obtain the result C which is then stored in the memory MEM. An advantage of this alternative is that less memory space is required.

Therefore, when another frequency has to be synthesized, for example fx, the stored signals NTH and NM, or alternatively C, can be recalled and operatively processed so as to compensate for the theoretical value of Nx as follows:

Nx(corrected)=NxTH*(NM/NTH)=NxTH/C.

It should be noted that the present invention is susceptible to being carried out as part of a software routine and/or as a hardware solution.

Thus, according to an embodiment of the present invention, a phase-locked loop demodulator that has a ceramic resonator as a reference frequency source or generator can be implemented which overcomes the current state of the art problems. Furthermore, the principle of comparing the VCO output frequency with that provided by the ceramic resonator based frequency source, and the storing and operative processing and application of compensation coefficients can be applied to a great number of circuits and applications that currently use piezoelectric crystals as a frequency reference source, provided that such applications include or are adapted to include the necessary elements such as a frequency comparator, a non-volatile memory, and operative control circuitry.

Having thus described several particular embodiments of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended to be limiting. The invention is limited only as defined in the following claims and equivalents thereto.

What is claimed is:

1. An apparatus for setting up a tuning frequency for a phase-locked loop demodulator that includes a voltage controlled oscillator, a first input, a second input coupled to a first switching means, and an output, the apparatus comprising:

frequency synthesizing circuitry having an output connected to a second switching means, a first input coupled to the output of the voltage controlled oscillator to receive a signal that is proportional to an output frequency of the oscillator and a second input for receiving a reference frequency, the frequency synthesizing circuitry providing a tuning signal to the voltage controlled oscillator, via the second switching means, to operatively control the voltage controlled oscillator;

frequency comparator circuitry for providing a first signal that corresponds to a difference between the output frequency of the voltage controlled oscillator and the reference frequency;

a ceramic resonator oscillator that provides the reference frequency;

means for storing a first value of the first signal; and control circuitry that is responsive to a plurality of signals including the first signal for operatively controlling the voltage controlled oscillator, the control circuitry including comparison means for comparing the first value of the first signal with a current value of the first signal so as to produce a second signal for adjusting the tuning signal provided by the frequency synthesizing circuitry in response to the second signal.

2. The apparatus of claim 1, wherein the control circuitry includes a microprocessor.

3. The apparatus of claim 2, wherein the means for storing is a non-volatile memory.

4. The apparatus of claim 3, wherein the memory is adapted to store the first value of the first signal.

5. The apparatus of claim 4, wherein the memory is adapted to initially store the first value of the first signal as part of a testing procedure when the apparatus is manufactured.

6. The apparatus of claim 5, wherein the memory is further adapted to store an updated value of the first signal during operation of the apparatus.

7. The apparatus of claim 5, wherein the memory is further adapted to store an updated value of the first signal during at least one of a power-up sequence and a start sequence of the apparatus.

8. The apparatus of claim 5, wherein the memory is further adapted to store an updated value of the first signal during at least one of a power-down sequence and a stop sequence of the apparatus.

9. The apparatus of claim 1, further comprising satellite signal receiving circuitry, coupled to the phase-locked loop demodulator, thereby forming a system that receives satellite signals.

10. The apparatus of claim 1, further comprising radio signal receiving circuitry, coupled to the phase-locked loop demodulator, thereby forming a system that receives radio signals.

11. The apparatus of claim 1, further comprising one of television signal receiving circuitry and video signal receiving circuitry, coupled to the phase-locked loop demodulator, thereby forming a system that respectively receives one of television signals and video signals.

12. A method for setting up a tuning frequency for a phase-locked loop demodulator having a voltage controlled oscillator, the method comprising the steps of:

generating a reference frequency by means of circuitry including a ceramic resonator;

connecting a frequency synthesizer to the voltage controlled oscillator;

synthesizing a tuning frequency for the voltage controlled oscillator that substantially corresponds to a required carrier frequency;

generating a first signal that corresponds to a difference between the synthesized tuning frequency and the reference frequency;

disconnecting the frequency synthesizer from the voltage controlled oscillator;

connecting a plurality of carrier frequencies to the phase-locked loop demodulator;

adjusting the voltage controlled oscillator such that it provides a frequency corresponding to a desired carrier frequency;

storing a first value of the first signal;

comparing the stored first value of the first signal with a current value of the first signal;

producing a second signal in response to a result of comparing the stored first value to the current value of the first signal;

applying the second signal to the frequency synthesizer; and adjusting the synthesized tuning frequency in response to the second signal.

13. The method of claim 12, wherein the step of storing the first value of the first signal is initially carried out as part of a testing procedure during a manufacturing process.

14. The method of claim 12, further comprising a step of updating the stored first value of the first signal during normal operation of the phase-locked loop demodulator.

15. The method of claim 12, further comprising a step of updating the stored first value of the first signal during at least one of a power-up sequence and a start sequence performed by the phase-locked loop demodulator.

16. The method of claim 12, further comprising a step of updating the stored first value of the first signal during at least one of a power-down sequence and a stop sequence performed by the phase-locked loop demodulator.

17. An apparatus for setting up a tuning frequency for a phased-locked loop demodulator having a first input to receive an oscillator input signal, a second input to receive a carrier frequency signal, and an output to provide an oscillator output signal, the apparatus comprising:

a ceramic resonator having an output providing a reference signal;

a switch having a first terminal coupled to the first input of the phased-locked loop demodulator, and a second terminal; and a tuning circuit having a first input coupled to the output of the ceramic resonator to receive the reference signal, a second input coupled to the output of the phased-locked loop demodulator to receive the oscillator output signal, and an output coupled to the second terminal of the switch to provide the oscillator input signal, the tuning circuit further including a first memory to store a first value based on the reference signal and the oscillator output signal when the phased-locked loop demodulator provides the oscillator output signal according to the oscillator input signal, and a second memory to store a second value based on the reference signal and the oscillator output signal when the phased-locked loop demodulator provides the oscillator output signal according to the carrier frequency signal, the tuning circuit adjusting the oscillator input signal according to the first value and the second value stored in the first memory and second memory, respectively.

18. The apparatus of claim 17, wherein the tuning circuit further includes:

a first comparator having a first input to receive the reference signal, a second input to receive the oscillator output signal, and an output to provide the first value and the second value; and wherein the second memory is a register, coupled between the output of the first comparator and the first memory.

19. The apparatus of claim 18, wherein the first value is based on the oscillator output signal provided by the phased-locked loop demodulator when the phase-locked loop demodulator receives the reference signal as the oscillator input signal; and wherein the tuning circuit further includes:

a second comparator, coupled to the first memory and the register, to provide a calibration result based on a comparison of the first value stored in the memory and the second value stored in the register, the tuning circuit adjusting the oscillator input signal according to the calibration result.

20. An apparatus for setting up a tuning frequency for a phased-locked loop demodulator having a first input to receive an oscillator input signal, a second input to receive a carrier frequency signal, and an output to provide an oscillator output signal, the apparatus comprising: a ceramic resonator having an output providing a reference signal;

a switch having a first terminal coupled to the first input of the phased-locked loop demodulator, and a second terminal; and tuning means, coupled to the output of the ceramic resonator, the output of the phased-locked loop demodulator, and the second terminal of the switch, for storing a first value based on the reference signal and the oscillator output signal when the phased-locked loop demodulator provides the oscillator output signal according to the oscillator input signal; storing a second value based on the reference signal and the oscillator output signal when the phased-locked loop demodulator provides the oscillator output signal according to the carrier frequency signal; and adjusting the oscillator input signal according to the first value and the second value.

21. The apparatus of claim 20, wherein the tuning means includes:

first comparing means for comparing the reference signal and the oscillator output signal, and providing the first value and the second value.

22. The apparatus of claim 21, wherein the first value is based on the oscillator output signal provided by the phased-locked loop demodulator when the phase-locked loop demodulator receives the reference signal as the oscillator input signal; and wherein the tuning means further includes:

second comparing means for comparing the first value and the second value, and providing a calibration result according to a comparison of the first value and the second value; and means for adjusting the oscillator input signal according to the calibration result.

23. A method for setting up a tuning frequency for a phased-locked loop demodulator having a first input to receive an oscillator input signal, a second input to receive a carrier frequency signal, and an output to provide an oscillator output signal, the apparatus comprising:

providing a reference signal from a ceramic resonator;

storing, in a first storage device, a first value based on the reference signal and the oscillator output signal when the phased-locked loop demodulator provides the oscillator output signal according to the oscillator input signal;

storing, in a second storage device, a second value based on the reference signal and the oscillator output signal when the phased-locked loop demodulator provides the oscillator output signal according to the carrier frequency signal; and adjusting the oscillator input signal according to the stored first value and the stored second value.

24. The method of claim 23, further comprising the steps of: comparing the reference signal and the oscillator output signal to provide the first value and the second value.

25. The method of claim 24, wherein the first value is based on the oscillator output signal provided by the phase-locked loop demodulator when the phase-locked loop demodulator receives the reference signal as the oscillator input signal; and further comprising the steps of:

comparing the first value and the second value to provide a calibration result according to a comparison of the first value and the second value, wherein the step of adjusting includes adjusting the oscillator input signal according to the calibration result.

26. A system for demodulating a communication signal from a communication signal source, comprising:

a receiving circuit to receive the communication signal from the communication signal source;

a phased-locked loop demodulator having a first input to receive an oscillator input signal, a second input coupled to the receiving circuit to receive a carrier frequency signal of the communication signal, and an output to provide an oscillator output signal; and a tuning device including:

a ceramic resonator having an output providing a reference signal;

a switch having a first terminal coupled to the first input of the phased-locked loop demodulator, and a second terminal; and a tuning circuit having a first input coupled to the output of the ceramic resonator to receive the reference signal, a second input coupled to the output of the phased-locked loop demodulator to receive the oscillator output signal, and an output coupled to the second terminal of the switch to provide the oscillator input signal, the tuning circuit further including:

a first memory to store a first value based on the reference signal and the oscillator output signal when the phased-locked loop demodulator provides the oscillator output signal according to the oscillator input signal, and a second memory to store a second value based on the reference signal and the oscillator output signal when the phased-locked loop demodulator provides the oscillator output signal according to the carrier frequency signal, the tuning circuit adjusting the oscillator input signal according to the first value and the second value stored in the first memory and second memory, respectively.

* * * * *